United States Patent Office 3,682,641

Patented Aug. 8, 1972

3,682,641

PHOTORESIST DEVELOPER EXTENDER BATHS CONTAINING POLYOXYALKYLENE ETHERS AND ESTERS AND PROCESS OF USE

Nancy Lee Cecile Casler, East Brunswick, N.J., and Barbara Egee Vincentsen, Tustin, Calif., assignors to E. I. du Pont de Nemours and Company, Wilmington, Del.

No Drawing. Filed Mar. 23, 1970, Ser. No. 22,030

Int. Cl. G03c 5/00

U.S. Cl. 96—35.1 8 Claims

ABSTRACT OF THE DISCLOSURE

Organic polymer photoresist-bearing elements are developed with a water-insoluble organic solvent developer to form a resist which is treated in a developer extender bath of a mixture of (1) a monocarboxylic acid, mono- or diester of a polyethylene glycol containing 2 to 25 $OCH_2CH_2$— groups, wherein the acyl radical of said ester contains 2–18 carbon atoms, and (2) a 2-alkoxyethanol, wherein alkoxy contains 2–4 carbon atoms. The novel extender baths may contain a non-ionic polyoxyethene surfactant. The bath extends the life of the developer solution and prevents formation of scum on the resist.

BACKGROUND OF THE INVENTION

This invention relates to the processing of negative working photoresists. More particularly, it relates to solutions which extend the life of developer baths.

It is the usual practice in preparing photoresists to process the exposed photopolymerizable element as follows (see Celeste, U.S. 3,469,982, Sept. 30, 1969): (1) develop in a bath that dissolves the unexposed photopolymerizable areas, (2) rinse the resist in water, and (3) dry. The surface may then be etched, plated, or processed in other ways.

As long as the developer is not spent, the above procedure will give a high quality photoresist. However, after 3–4 uses, the build-up of polymer, including photopolymerized solids in the developer, is such that there is a tendency for the water rinse to precipitate the polymer solids out of the developer onto the resist surface. This leads to the formation of a scum on the resist surface, resulting in an uneven plating and etching of the resist.

If the above procedure for processing a photoresist is modified to include the step of washing the resist in an extender bath of this invention, the life of the developer is extended considerably. Such a bath prevents formation of scum on the resist surface during the water-rinse and gives a superior photoresist.

SUMMARY OF THE INVENTION

It is an object of this invention to provide processes and solutions for the treatment of photoresists. It is a further object to provide such solutions which prolong the usefulness of developer baths. Such solutions should also afford a resist whose surface can be uniformly plated and etched.

The above objects are accomplished by a process comprising forming a photoresist by treatment of an exposed photoresist-forming element with a water-insoluble organic solvent developer and rinsing the photoresist with an aqueous solution, characterized in that prior to rinsing, the photoresist is treated in a developer extender comprising a mixture of a (1) monocarboxylic acid, mono- or diester of a polyethylene glycol containing 2 to 25 oxyethylene groups and wherein the acyl radical is a fatty acid acyl radical of 2–18 carbon atoms, and (2) a 2-alkoxyethanol wherein alkoxy contains 2–4 carbon atoms. For every 100 parts by weight of the mixture, there may be present 0.1 to 10 parts of an aliphatic non-ionic surfactant.

The novel extender baths of this invention prolong the usefulness of developer solutions, making developer use more economical. Another advantage of this invention is that the extender baths eliminate formation of scum on the resist during water rinse, leading to a more evenly plated and etched resist.

DESCRIPTION OF THE PREFERRED EMBODIMENTS

In a preferred embodiment of this invention, an exposed photopolymerizable layer on a copper support is developed for about 60–120 seconds in a spray of methyl chloroform, which washes away the underexposed areas of the film element. The element is then swirled for about 15–20 seconds in a bath of about 1:1 butyl Carbitol/Carbitol acetate and about 2% of the monooleyl ether of polyethylene glycol (averaging 10 oxyethylene units). After washing in water and drying, the element is ready for plating.

Although the extender baths of this invention are particularly suitable following use of methyl chloroform or another halogenated aliphatic hydrocarbon solvent, e.g., methylene chloride and trichloroethylene solutions, these baths are equally useful in extending the life of almost any water-insoluble developer which is a solvent for the photopolymerizable compositions of this invention, and which is soluble in the extender baths.

Solutions which are to serve as extenders must be solvents for the photopolymerizable material and must also be compatible with the developer and water. Such solutions comprise, by weight, 99–10% of a mono- or diester of polyethylene glycol, and 1–90% of an ethylene glycol monoalkyl ether. The solutions may also contain for every 100 parts by weight of the mixture (1) and (2) from 0.1 to 10 parts of an aliphatic non-ionic surfactant containing a polyoxyethylene radical of at least 10 —$OCH_2CH_2$ groups.

Preferred mono- and diesters of polyethylene glycol are diethylene glycol monoacetate and triethylene glycol diacetates.

Preferred ethylene glycol mono-substituted alcohols are diethylene glycol monobutyl ether, 2-ethoxyethanol, and 2-n-butoxyethanol.

Aliphatic non-ionic surfactants which may be added to the extender baths to increase their efficiency include the mono-substituted polyoxyethylene ethanols, such as the monoleyl ethers of polyethylene glycols and octylphenoxypoly(ethyleneoxy)ethanol.

Photopolymerizable elements which may be processed using the solutions and procedures of this invention can be prepared by conventional prior art procedures, i.e., laminating a photopolymerizable stratum onto a suitable support. Such procedures are disclosed in U.S. Pat. 3,469,982.

Photopolymerizable compositions useful in preparing photoresists include a wide variety of photopolymerizable compounds and binders. The photopolymerizable compositions generally contain at least one non-gaseous ethylenically unsaturated monomer, as disclosed in Plambeck, U.S. 2,760,863, Aug. 28, 1966.

The diacrylates and dimethacrylate of ethylene, di-, tri- and tetraethylene glycols and pentaerythritol, tri, tetra- and penta-acrylates and methacrylates are preferred. Also useful are the polymeric esters of Schoenthaler, U.S. 3,418,295, Dec. 24, 1968. Photocrosslinkable polymers may also be used in the photopolymerizable systems. Included among such polymers are the polyvinyl cinnamates, polymeric chalcones and polymeric diazo compounds.

U.S. 2,760,863 describes various suitable ethylenically unsaturated compounds, thermoplastic polymeric binders, addition polymerization initiators activatable by actinic light and other constituents. Other ethylenically unsaturated monomers which may be used are disclosed in U.S. Celeste 3,261,686 and Cohen et al. 3,380,831. For polymerizable polymers, no binder is necessary, although a small amount may be used. In addition, photoinitiators, plasticizers, thermal inhibitors, colorants, fillers, etc., may also be present.

Other polymerizable polymers are those in U.S. 3,418,295.

Other suitable binders and monomers are disclosed in Celeste, U.S. 3,469,982. These binders include copolyesters, nylons or polyamides, vinylidene chloride copolymers, ethylene vinyl acetate copolymers, cellulosic ethers, synthetic rubber, cellulose esters, polyvinyl esters, polyacrylate and alpha-alkyl polyacrylate esters, polyvinyl chloride and copolymers, polyvinyl acetal, polyformaldehydes, polyurethanes, polycarbonates and polystyrenes.

Celeste U.S.P. 3,469,982 also discloses useful free-radical initiated, chain-propagating, addition polymerizable, ethylenically unsaturated compounds which, in addition to the ethylenically unsaturated monomers already mentioned, can be used with the above-mentioned polymer compounds.

Free-radical generating addition polymerization initiators activatable by actinic radiation includes the substituted and unsubstituted polynuclear quinones described in Notley U.S.P. 2,951,758, Sept. 6, 1960.

Other useful photoinitiators are described in Plambeck U.S. 2,760,863. Also to be used are the photoreducible dyes and reducing agents disclosed in Oster, U.S. 2,850,445; 2,875,047; 3,097,096; and Oster et al., U.S. 3,074,794; 3,097,097 and 3,145,104, as well as dyes of the phenazine, oxazine and quinone classes. Benzophenone/4,4′-bis(dimethylamino)benzophenone is an especially suitable initiating system.

Thermal polymerization inhibitors useful in photopolymerizable compositions include p-methoxyphenol, hydroquinone and alkyl and aryl-substituted hydroquinones and quinones, tert-butyl catechol, pyrogallol, copper resinate, naphthylamines, beta-naphthol, cuprous chloride, 2,6-di-tert-butyl p-cresol, phenothiazine, pyridine, nitrobenzene and dinitrobenzene. Other useful inhibitors include p-toluquinone and chloranil.

The photopolymerizable composition may be laminated or applied from solution onto an etchable metal surface which may be copper, magnesium, zinc, alloys of such metals, aluminum, anodized and dyed anodized aluminum, steel, steel alloys and beryllium-copper alloys.

The extender baths described herein are useful in the treatment of any element prepared from a resist. Such elements may be photoengraved, pattern-plated, multiplated, chemically-milled, etc., to produce printed circuits, nameplates, transistors, etc.

The following examples will further illustrate this invention, but are not intended to limit the scope in any manner.

EXAMPLE I

A photopolymerizable layer consisting of polymethylmethacrylate, pentaerythiotol triacrylate, triethyleneglycol diacetate, 2-tert-butylanthraquinone, 2,2′-methylene-bis-(4-ethyl-6-tert-butylphenol) and C.I. Solvent Red 36 on a polyethylene terephthalate support was laminated to a copper clad, expoxy-fiber glass board and exposed for 2 minutes to actinic radiation through a high-contrast transparency.

After stripping off the polyethylene terephthalate, the photopolymerizable element was developed for 60 seconds in a methyl chloroform spray which contained 0.6% photopolymerizable solids. This left the unexposed areas of the element free of photopolymerizable material. The board was then rinsed in water and flash-plated in a solder bath.

The rinsing operation left a layer of scum on the unexposed areas of the board. This resulted in an uneven plating of the copper board.

The above developing procedure was repeated with a second resist element, except that in this instance the developing step was followed by a 15-second swirl in a bath of 1:1 carbitol acetate/butyl carbitol and 1% monooleyl ether of polyethylene glycol (averaging 10 ethylene glycols). Washington the resist in water did not result in scum formation in the unexposed areas of the copper plate.

Following development, the resist was plated for 15 minutes in a solder bath. The resist was then removed from the board and the element was etched in a ferric chloride solution, which removed the copper from the exposed areas of the element. This gave a high quality printed circuit board.

EXAMPLE II

The exposed copper board of Example I was developed for 60 seconds in a methyl chloroform bath that contained 0.6% photopolymerizable solids. The board was then swirled for 15 seconds in a bath of 1:1 carbitol acetate/butyl carbitol and 2% of the monooleyl ether of polyethylene glycol, and containing 2% photopolymerizable solids and 1% methyl chloroform containing 0.5% photopolymerizable solids.

After rinsing in water, the element was plated for 15 minutes in a solder bath. No scum formation accompanied the rinsing step and the board plated uniformly.

The resist was then removed and the board etched as in Example I to give a high quality printed circuit board.

EXAMPLE III

The exposed copper plate of Example I, developed in the solution of Example I, was swirled for 15 seconds in an extender bath loaded with 2% soldis and 7% methyl chloroform containing 0.5% solids. The extender bath was 1:1 Carbitol acetate/butyl Carbitol with 1% monooleyl ether of polyethylene glycol.

Rinsing the plate in water resulted in very little scumming on the copper board.

The board was then plated, the resist removed, and the copper etched as in Example I to give a printed circuit board.

EXAMPLE IV

The exposed and developed copper plate of Example I was washed for 15 seconds in an extender bath of 1:1 Carbitol acetate/butyl Carbitol and 2% monooleyl ether of polyethylene glycol and loaded with 2% solids and 10% methyl chloroform having 0.6% solids.

There was no scum formation on the copper surface when the plate was rinsed in water. Plating the copper for 10 seconds in a solder bath, followed by removal of the resist areas and etching of the copper board gave an excellent printed circuit.

EXAMPLE V

The exposed and developed copper plate of Example I was washed for 15 seconds in an extender bath of 1:1 triethylene glycol diacetate/butyl Carbitol and 1% solids.

The plate was rinsed in water with no scum formation on the copper surface.

The resist plated easily and uniformly in a solder bath, and the printed circuit resulting from the etching of the copper board was of a high quality.

EXAMPLE VI

The exposed and developed copper plate of Example I was washed for 15 seconds in an extender bath of 1:1 ethoxy ethanol/ethoxyethyl acetate and 2% monooleyl ether of polyethylene glycol, and which bath was loaded with 2% solids and 3% methyl chloroform containing 0.5% solids.

There was no scum formation on the copper plate after the plate was rinsed with water.

The plate exhibited excellent plating characteristics when plated for 10 seconds in a solder bath and was suitable for producing a printed circuit of a desired quality.

EXAMPLE VII

Repeating the procedures of Example VI, with a 2% solution of octylphenoxypoly(ethyleneoxy)ethanol substituted for the monooleyl ether of polyethylene glycol in the extender bath, resulted in a photoresist that did not scum on rinsing in water and which plated uniformly in a 10-second solder bath.

EXAMPLE VIII

A photopolymerizable layer consisting of poly(methyl methacrylate/acrylonitrile/acrylated glycidyl acrylate, 65/10/25, prepared according to Example XIV of Schoenthaler U.S. 3,418,295, poly(methyl methacrylate ($\beta$-hydroxyethyl acrylate, 90/10), triethylene glycol diacetate, 2-tert-butylanthraquinone, 2,2 - methylene-bis-(4-ethyl-6-tert-butylphenol), ethyl violet dye (C.I. 42,600), and methyl ethyl ketone on a polyethylene terephthalate support was laminated to a copper-clad, epoxy-fiber glass board and exposed for 2 min. to actinic radiation through a high-contrast transparency.

After developing as in Example I, the board was washed for 15 sec. in an extender bath of 1:1 Carbitol acetate/butyl Carbitol and 2% monooleyl ether of polyethylene glycol and loaded with 2% solids and methyl chloroform having 0.5% solids. Rinsing in water did not leave a scum on the copper board.

EXAMPLE IX

The following procedure was used to multiplate a copper board.

A photopolymerizable layer consisting of a cross-linkable copolymer, prepared from a vinyl addition polymer, an acrylic acid, a tert-amine esterification catalyst, and a polymerization inhibitor, as described in Example I of U.S. 3,418,295, combined with 2-tert-butylanthraquinone, triethylene glycol diacetate, and 2,2′-methylene-bis-(4-ethyl-6-tert-butylphenol) was dip-coated on a copper-clad fiber glass support intended for use as a printed circuit. After coating, the photosensitive layer was dried and exposed for 30 seconds through a lithographic type negative in a conventional vacuum printing frame. The board was then developed for 60 seconds in a methyl chloroform spray which contained 0.7% photopolymerizable solids, after which time it was washed for 15 seconds in a bath of 1:1 Carbitol acetate/butyl Carbitol and 1% monooleyl ether of polyethylene glycol and then washed clean with water. This was followed by a 30-second washing in 20% sulfuric acid and a 15-second rinse in water.

The element was then etched for 30 sec. in 1 N ammonium persulfate and rinsed for 15 sec. in water. After 30 sec. in a 20% sulfuric acid bath and a 15 sec. water-rinse, the element was plated for 30 min. in a bath of copper pyrophosphate at 30 amp./ft.$^2$.

After a 15 sec. water-rinse, the element was plated for 20 min. in a nickel sulfamate bath at 30 amp./ft.$^2$. This was followed by a 15 sec. water-rinse and a 10-min. plating in a bath of acid gold at 10 amp./ft.$^2$.

The element was then rinsed in water, the resist stripped from the board and the board etched in a ferric chloride bath to give a multiplated circuit board of high quality.

EXAMPLE X

A photopolymerizable layer like that of Example I was laminated to both sides of a 0.001″ stainless steel sheet, and both sides then exposed for 2 min. to actinic radiation through an image-bearing transparency. After developing for 60 sec. in a methyl chloroform spray containing 0.6% photopolymerizable solids, the element was washed for 15 sec. in a bath of 1:1 Carbitol acetate/butyl Carbitol and 1% monooleyl ether of polyethylene glycol. This was followed by etching in ferric chloride to give a printed circuit board.

EXAMPLE XI

The following procedure was used to prepare a nameplate from a photoresist.

A photopolymerizable layer like that of Example I was laminated to a sheet of anodized aluminum and exposed for 2 min. to actinic radiation through an image-bearing transparency. The element was then developed for 60 sec. in a methyl chloroform spray and washed for 15 sec. in a bath of 1:1 Carbitol acetate/butyl Carbitol and 2% monooleyl ether of polyethylene glycol. After rinsing in water, the element was treated for 2 min. with 10% sodium hydroxide and then water rinsed. This removed the dye from the nonprotected areas.

The resist was then stripped away; giving a high-quality nameplate.

EXAMPLE XII

A silicon wafer of the type used for transistors was prepared as follows:

A photopolymerizable layer like that of Example I was laminated to a silicon wafer coated with a layer of silicon dioxide. The wafer was then exposed for actinic radiation for 2 min. through an image-bearing transparency and developed for 60 sec. in a methyl chloroform spray containing 0.7% solids. This was followed by a 15-sec. swirl in a bath of 1:1 Carbitol acetate/butyl Carbitol and 1% monooleyl ether of polyethylene glycol and a water rinse. The wafer was then etched in 48% hydrofluoric acid to give an image in silicon dioxide.

In the foregoing examples, the ratio (e.g., 1:1) of the solvents is by weight and the percentages are by weight. The ratios may vary from 0.25–1:1 and the percentages of the surfactant can vary from 0.5 to 4% or more.

The embodiments of the invention in which an exclusive property or privilege is claimed are defined as follows:

1. A process which comprises forming a photoresist by treatment of a photographic element comprising a photopolymerizable layer at least a part of which has been exposed to actinic radiation with a water-insoluble organic solvent developer and rinsing the photoresist with an aqueous solution, characterized in that prior to rinsing, the photoresist is treated with a developer extender comprising a mixture of (1) an aliphatic monocarboxylic acid, mono or diester of a polyethylene glycol containing 2 to 25 oxyethylene groups and wherein the acyl radical is a fatty acid acyl radical of 2 to 18 carbon atoms, and (2) an alkoxyethanol wherein alkoxy contains 2–4 carbon atoms.

2. A process according to claim 1 wherein constituents (1) and (2) are present in the amounts, by weight, 99–10% and 1–90%, respectively.

3. A process according to claim 2 wherein for every hundred parts, by weight, of constituents (1) and (2) there is present up to 10 parts by weight of an aliphatic non-ionic surfactant.

4. A process according to claim 2 wherein the photoresist-forming element is a photopolymerizable layer containing at least one non-gaseous ethylenically unsaturated compound and an addition polymerization initiator activatable by actinic light and thermally inactive below 185° C.

5. A process according to claim 4 wherein the ethylenically unsaturated compound is a polyethylene glycol or a pentaerythritol polyacrylate or polymethacrylate in admixture with a polyacrylate or polyacrylate.

6. A process according to claim 4 wherein said solvent is $CH_3CCl_3$.

7. A process according to claim 4 wherein the developer extender contains diethylene glycol diacetate and the mono-n-butyl ether of diethylene glycol.

8. A process according to claim 7 wherein the developer extender contains the monooleyl ether of polyethylene glycol.

References Cited

UNITED STATES PATENTS

| | | | |
|---|---|---|---|
| 3,475,171 | 10/1969 | Alles | 96—35.1 |
| 3,376,138 | 4/1968 | Giangualano et al. | 96—35.1 |
| 3,376,139 | 4/1968 | Gianbualano et al. | 96—35.1 |
| 3,380,831 | 6/1968 | Cohen et al. | 96—115 |
| 3,261,686 | 7/1966 | Celeste | 96—115 |
| 2,760,863 | 8/1956 | Palambeck, Jr. | 96—35.1 |

NORMAN G. TORCHIN, Primary Examiner

E. C. KIMLIN, Assistant Examiner